(12) United States Patent
Miyazaki et al.

(10) Patent No.: US 9,269,605 B2
(45) Date of Patent: Feb. 23, 2016

(54) SUBSTRATE GRIPPING APPARATUS

(71) Applicant: EBARA CORPORATION, Tokyo (JP)

(72) Inventors: Mitsuru Miyazaki, Tokyo (JP); Naoki Matsuda, Tokyo (JP); Junji Kunisawa, Tokyo (JP); Manao Hoshina, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/150,257

(22) Filed: Jan. 8, 2014

(65) Prior Publication Data
US 2014/0197610 A1    Jul. 17, 2014

(30) Foreign Application Priority Data

Jan. 11, 2013  (JP) .................................. 2013-003291

(51) Int. Cl.
*H01L 21/687*  (2006.01)
(52) U.S. Cl.
CPC ......... *H01L 21/68728* (2013.01); *Y10T 279/26* (2015.01)
(58) Field of Classification Search
CPC ...... B25B 11/00; B25B 11/005; B25B 11/02; B23K 3/087
USPC ................................ 269/903, 900, 21, 289 R
See application file for complete search history.

(56) References Cited

U.S. PATENT DOCUMENTS

| 4,567,938 | A  | * | 2/1986  | Turner ......................... 165/80.1   |
| 5,005,814 | A  | * | 4/1991  | Gumbert ....................... 269/309     |
| 5,067,695 | A  | * | 11/1991 | Huddleston ..................... 269/21     |
| 6,184,972 | B1 | * | 2/2001  | Mizutani et al. ................ 355/72     |
| 8,276,898 | B2 | * | 10/2012 | Avoyan et al. ................... 269/21    |
| 8,608,146 | B2 | * | 12/2013 | Brugger et al. ............... 269/296      |
| 8,888,087 | B2 | * | 11/2014 | Okabe et al. ............... 269/289 R      |
| 2014/0197610 | A1 | * | 7/2014 | Miyazaki et al. ............. 279/133       |

FOREIGN PATENT DOCUMENTS

| JP | 09-171984 B2 | 6/1997  |
| JP | 10-059540 A  | 3/1998  |
| JP | 11-163094 A  | 6/1999  |
| JP | 2009-295751 A | 12/2009 |

* cited by examiner

*Primary Examiner* — Lee D Wilson
(74) *Attorney, Agent, or Firm* — Pearne & Gordon LLP

(57) ABSTRACT

The present invention relates to a substrate gripping apparatus includes a base, a plurality of support posts which are vertically movable relative to the base, a lifting mechanism configured to lift the support posts, and a substrate holder and a substrate guide member mounted to each of the support posts. Each of the support posts includes a relative movement mechanism configured to move the substrate holder in such a direction that the substrate holder releases a peripheral portion of a substrate, while raising the substrate guide member relative to the substrate holder, when the support post moves upward, and to move the substrate holder in such a direction that the substrate holder grips the peripheral portion of the substrate, while lowering the substrate guide member relative to the substrate holder, when the support post moves downward.

14 Claims, 10 Drawing Sheets

SUBSTRATE GRIPPING APPARATUS

CROSS REFERENCE TO RELATED APPLICATION

This document claims priority to Japanese Patent Application No. 2013-3291 filed Jan. 11, 2013, the entire contents of which are hereby incorporated by reference.

BACKGROUND OF THE INVENTION

1. Field of the Invention

The present invention relates to a substrate gripping apparatus, and more particularly to a substrate gripping apparatus which can be used in a cleaning apparatus or a drying apparatus for a substrate, such as a semiconductor wafer.

2. Description of the Related Art

In a semiconductor device fabrication process, a substrate is subjected to a cleaning process or a drying process after the substrate is polished or plated. For example, in cleaning of a substrate, a cleaning liquid is supplied to the substrate while the substrate, which is gripped by a substrate gripping apparatus, is being rotated. A mechanism of gripping a substrate by chucks, which are driven by an actuator, is known as a conventional substrate gripping apparatus.

SUMMARY OF THE INVENTION

The present invention is directed to an improvement of the conventional substrate gripping apparatus, and provides a substrate gripping apparatus which can securely grip a substrate.

An embodiment is a substrate gripping apparatus, comprising: a base; a plurality of support posts which are supported by the base and are vertically movable relative to the base; a lifting mechanism configured to lift the support posts; and a substrate holder and a substrate guide member mounted to each of the support posts. Each of the support posts includes a relative movement mechanism configured to move the substrate holder and the substrate guide member relative to each other. The relative movement mechanism is configured to move the substrate holder in such a direction that the substrate holder releases a peripheral portion of a substrate, while raising the substrate guide member relative to the substrate holder, when the support post moves upward, and to move the substrate holder in such a direction that the substrate holder grips the peripheral portion of the substrate, while lowering the substrate guide member relative to the substrate holder, when the support post moves downward.

The relative movement mechanism includes: a first rod; a second rod configured to be vertically movable relative to the first rod and to be lifted by the lifting mechanism; a first spring arranged between the base and the first rod and configured to bias the first rod downward; a second spring arranged between the first rod and the second rod and configured to bias the second rod downward; a support shaft secured to the first rod and configured to rotatably support the substrate holder; and a coupling mechanism configured to couple the second rod to the substrate holder.

The first spring has a spring constant which is lower than a spring constant of the second spring.

The first spring has a spring constant which is higher than a spring constant of the second spring.

The substrate guide member is secured to the second rod.

The relative movement mechanism is configured to raise the substrate guide member to a position higher than the substrate holder and lower the substrate guide member to a position lower than the substrate holder.

The substrate holders are arranged at equal intervals around a central axis of the base and are configured to perform centering of the substrate by gripping the peripheral portion of the substrate.

The substrate holder has a chuck portion configured to grip the peripheral portion of the substrate and a slope on which the peripheral portion of the substrate is to be placed, and the chuck portion is formed integrally on the slope.

When the support posts move upward, the substrate guide members are raised relative to the substrate holders. Therefore, the substrate, which has been transported from a transport mechanism, is guided by the substrate guide members to the substrate holders, so that the substrate holders can securely grip the substrate. When the support posts move downward and the substrate holders grip the substrate, the substrate guide members are lowered relative to the substrate holders. This can prevent a liquid from bouncing off the substrate guide members when the substrate gripping apparatus is applied to an apparatus which uses the liquid, such as a substrate cleaning apparatus.

DETAILED DESCRIPTION

Embodiments will now be described in detail with reference to the drawings.

Figure 1:
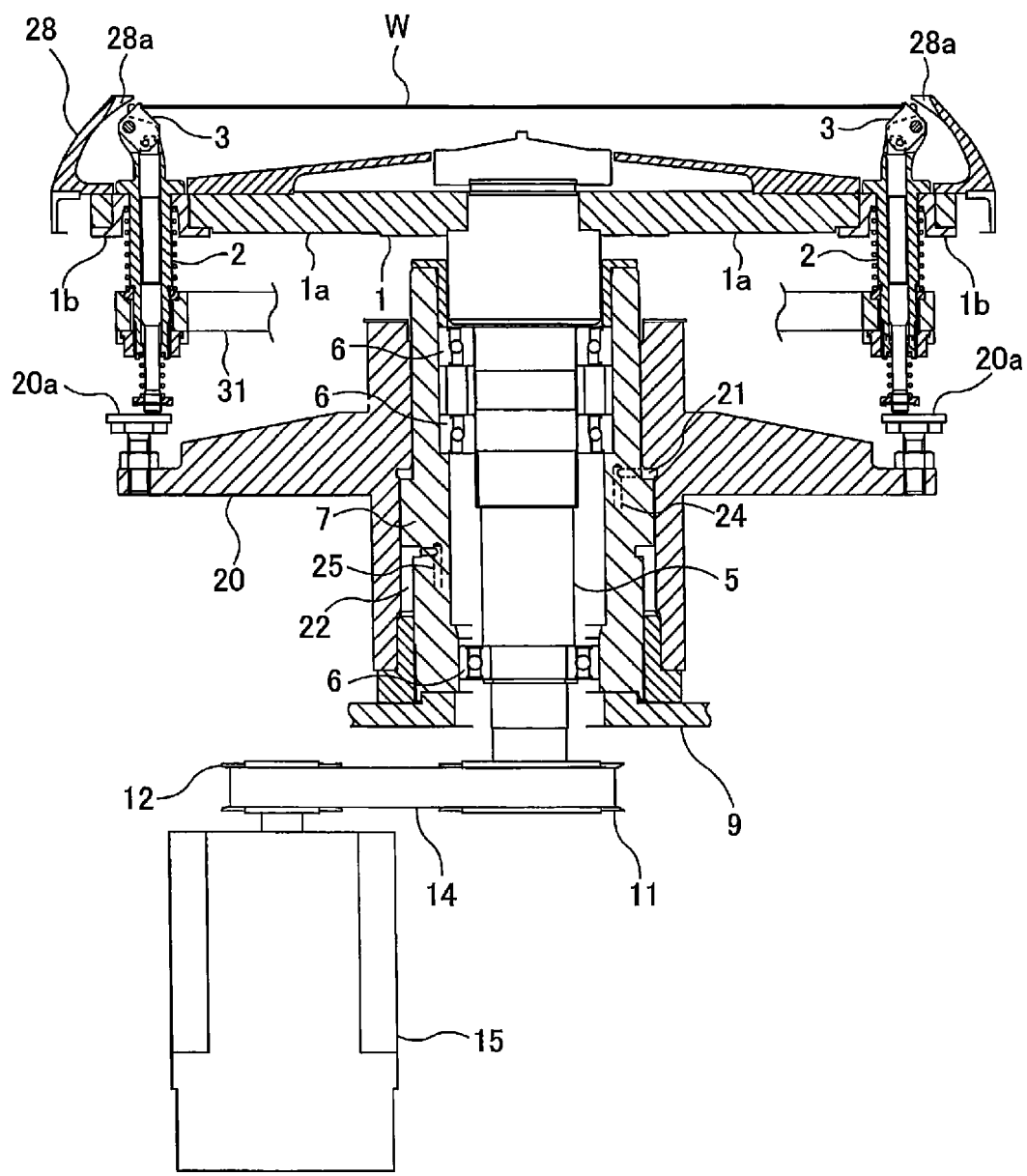
FIG. 1 is a vertical cross-sectional view of a substrate gripping apparatus according to a first embodiment.
Figure 2:
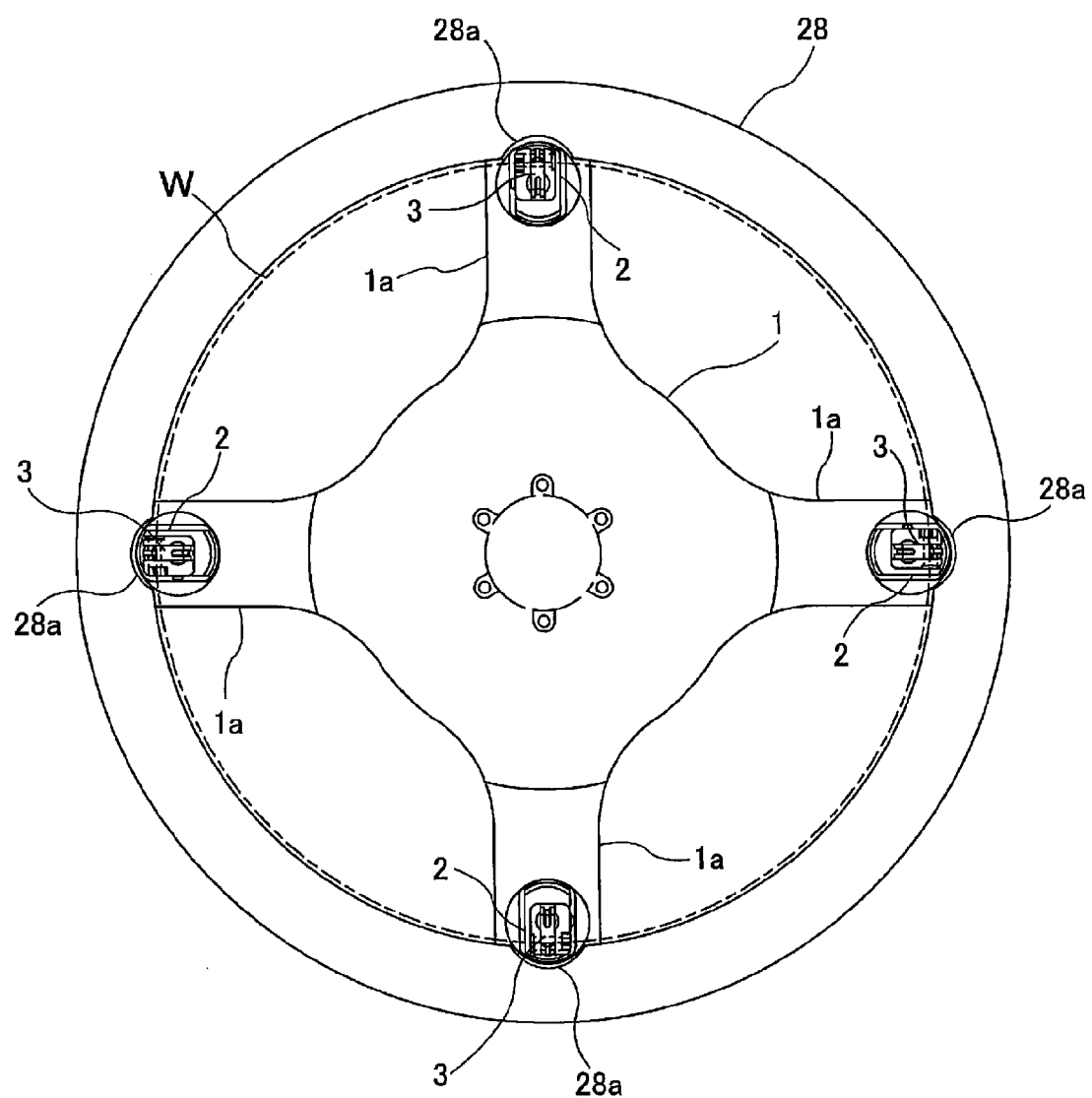
FIG. 2 is a plan view of the substrate gripping apparatus according to the first embodiment.

FIG. 1 is a vertical cross-sectional view of a substrate gripping apparatus according to a first embodiment. FIG. 2 is a plan view of the substrate gripping apparatus according to the first embodiment.

As shown in FIG. 1 and FIG. 2, the substrate gripping apparatus includes a base 1 having four arms 1a, four support posts 2 each supported by a distal end of each arm 1a, and four substrate holders 3 coupled to the support posts 2, respectively. The base 1 is secured to an upper end of a rotational shaft 5, which is rotatably supported by bearings 6. The bearings 6 are fixed to an inner circumferential surface of a cylindrical member 7 that surrounds the rotational shaft 5. A lower end of the cylindrical member 7 is mounted to a pedestal 9 and is fixed in its position. The rotational shaft 5 is coupled to a motor 15 through pulleys 11, 12 and a belt 14 so that the base 1 is rotated about its axis when the motor 15 is set in motion. A symbol W represents a substrate, such as a wafer. A wafer W is gripped by the substrate holders 3 and rotated about its central axis by the motor 15.

Figure 3:
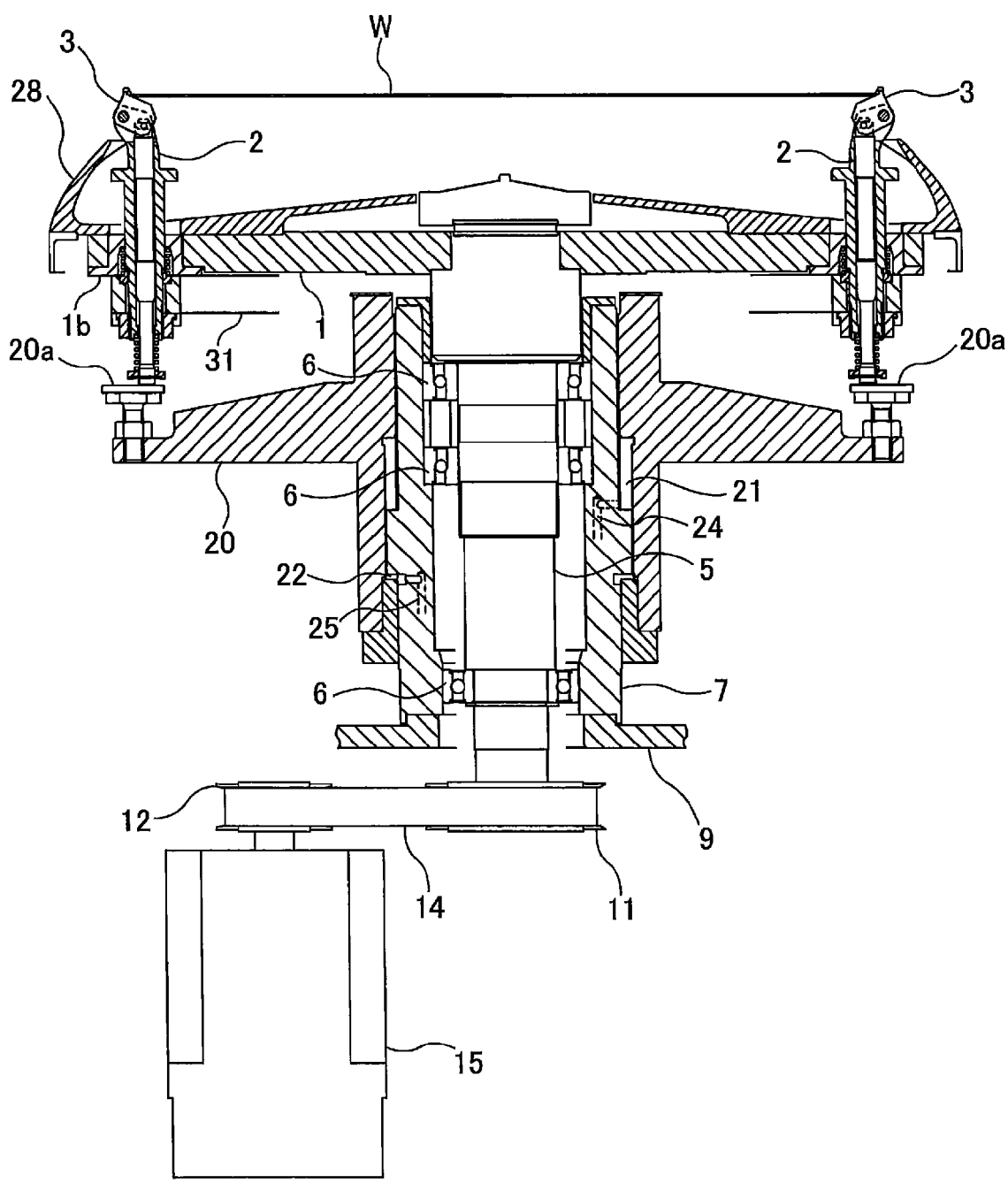
FIG. 3 is a diagram corresponding to FIG. 1, showing the substrate gripping apparatus when a lifting mechanism is in a raised position.

A lifting mechanism 20 for lifting the support posts 2 is provided so as to surround the cylindrical member 7. The lifting mechanism 20 is configured to be able to slide vertically relative to the cylindrical member 7. The lifting mechanism 20 has four pushers 20a that contact lower ends of the four support posts 2 to lift the support posts 2. A first gas chamber 21 and a second gas chamber 22 are formed between an outer circumferential surface of the cylindrical member 7 and an inner circumferential surface of the lifting mechanism 20. The first gas chamber 21 and the second gas chamber 22 communicate with a first gas flow passage 24 and a second gas flow passage 25, respectively. The first gas flow passage 24 and the second gas flow passage 25 are coupled to a not-shown pressurized gas supply source. When pressure in the first gas chamber 21 is increased higher than pressure in the second gas chamber 22, the lifting mechanism 20 is moved upward as shown in FIG. 3. Conversely, when the pressure in the second gas chamber 22 is increased higher than the pressure in the first gas chamber 21, the lifting mechanism 20 is moved downward as shown in FIG. 1. In this manner, the lifting mechanism 20 can move up and down the four support posts 2 simultaneously.

The outer circumferential surfaces of the four support posts 2 are secured to a ring member 31 so that the support posts 2 can move vertically together with the ring member 31. The ring member 31 extends along an arrangement direction of the support posts 2 and is located below the base 1. The ring member 31, the rotational shaft 5, the base 1, and the cylindrical member 7 are arranged concentrically.

A rotary cup 28 is secured to an upper surface of the base 1. This rotary cup 28 is provided for the purpose of receiving a liquid that has been scattered around by a centrifugal force from the rotating wafer W. FIG. 1 and FIG. 3 show a vertical cross-sectional view of the rotary cup 28. The rotary cup 28 is arranged so as to surround the peripheral portion of the wafer W in its entirety. The rotary cup 28 has a vertical cross-sectional shape that is inclined radially inwardly. Further, the rotary cup 28 has an inner circumferential surface that is formed by a smooth curved surface. An upper end rim of the rotary cup 28 lies close to the wafer W, and an inner diameter of the rotary cup 28, at its upper end, is slightly larger than a diameter of the wafer W. Cutout portions 28a, each having a shape conforming to the shape of the outer periphery of each support post 2, are formed in positions corresponding to positions of the support posts 2. Obliquely extending drain holes (not shown) are formed in the bottom of the rotary cup 28.

Figure 4:
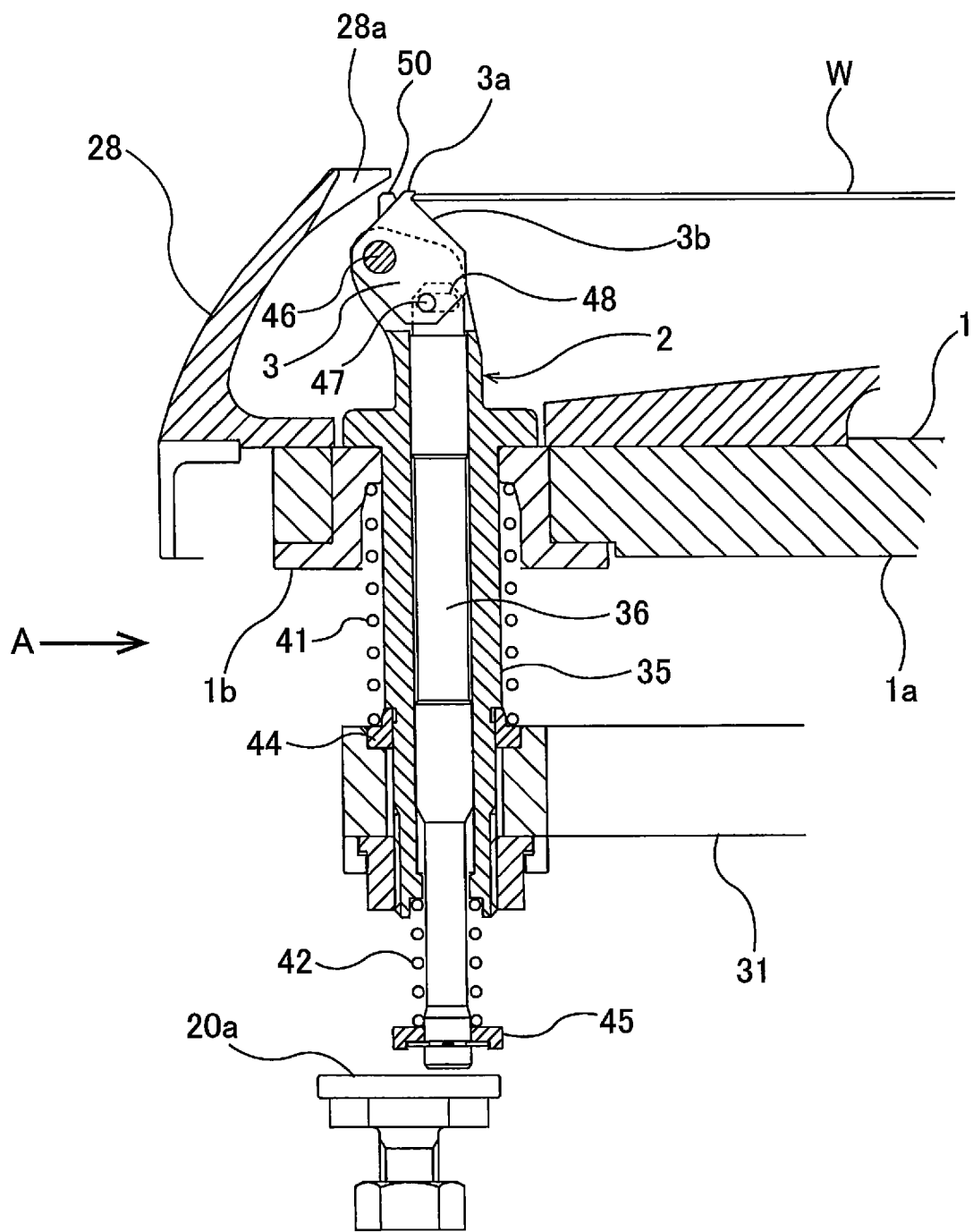
FIG. 4 is an enlarged view of a support post and a substrate holder.
Figure 5A:
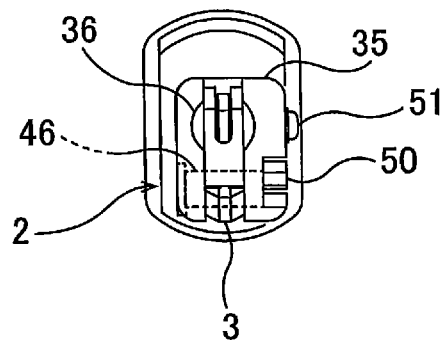
FIG. 5A is a top view of the support post and the substrate holder.
Figure 5B:
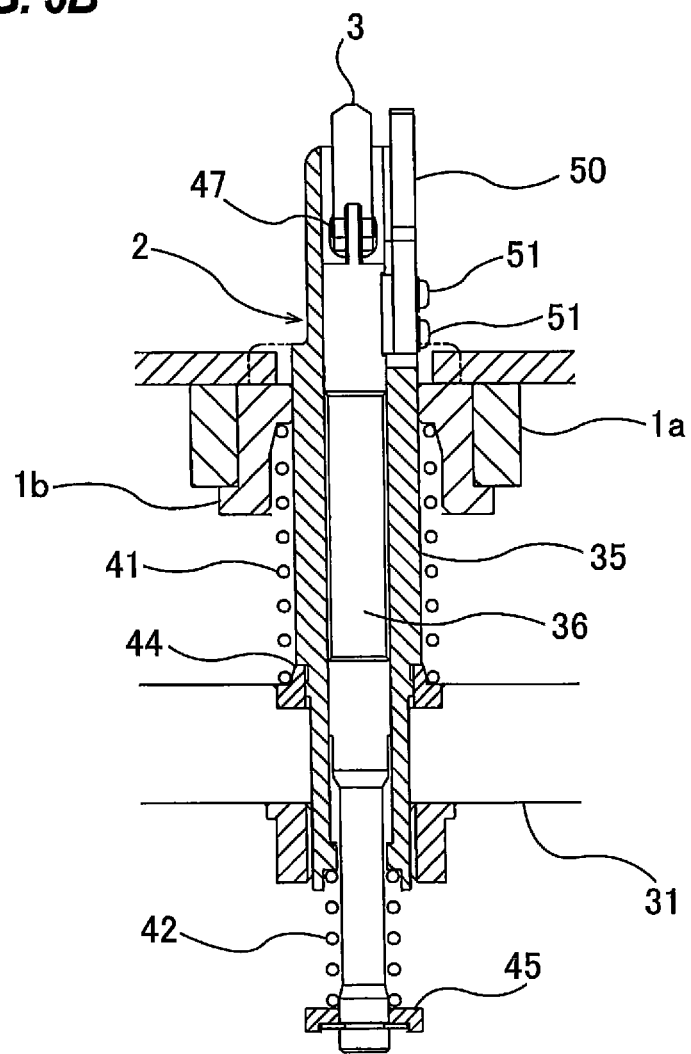
FIG. 5B is a cross-sectional view of the support post and the substrate holder as viewed in a direction indicated by arrow A shown in FIG. 4.

The four support posts 2 have the same construction, and the four substrate holders 3 have the same construction. FIG. 4 is an enlarged view of the support post 2 and the substrate holder 3. FIG. 5A is a top view of the support post 2 and the substrate holder 3, and FIG. 5B is a cross-sectional view of the support post 2 and the substrate holder 3 as viewed in a direction indicated by arrow A shown in FIG. 4. The arm 1a of the base 1 has a holding member 1b for slidably holding the support post 2. The holding member 1b may be formed integrally with the arm 1a. The holding member 1b has a vertical through-hole through which the support post 2 is inserted. The diameter of the through-hole is slightly larger than the diameter of the support post 2, so that the support post 2 can move vertically relative to the base 1.

The substrate holder 3 has a slope 3b which is an upper surface thereof. This slope 3b is inclined downward in a radially inward direction of the wafer W. A chuck potion 3a, which is brought into contact with the peripheral portion of the wafer W, is formed integrally on the slope 3b of the substrate holder 3. In this embodiment, the four substrate holders 3 are provided for gripping the peripheral portion of the wafer W as shown in FIG. 2. The peripheral portion of the wafer W is first placed on the slopes 3b, and is then gripped by the chuck portions 3a. The substrate holders 3 are arranged at equal intervals around the central axes of the base 1 and the rotational shaft 5. Accordingly, centering of the wafer W can be performed automatically when the substrate holders 3 grip the peripheral portion of the wafer W.

Each of the support posts 4 includes a first rod 35, which is vertically slidably held by the holding member 1b, and a second rod 36 housed in the first rod 35. The substrate holder 3 is coupled to upper ends of the first rod 35 and the second rod 36. The first rod 35 has a cylindrical shape, and the second rod 36 is vertically movable in the first rod 35. Thus, the second rod 36 can move vertically relative to the first rod 35. The first rod 35 is secured to the ring member 31.

A first spring 41 is disposed between the base 1 and the first rod 35. More specifically, a spring stopper 44 is secured to the outer periphery of the first rod 35, and the first spring 41 is arranged between the spring stopper 44 and the holding member 1b of the base 1. The first spring 41 biases the first rod 35 downward.

A second spring 42 is disposed between the first rod 35 and the second rod 36. More specifically, a spring stopper 45 is secured to the outer periphery of the second rod 36, and the second spring 42 is arranged between the spring stopper 45 and the lower end of the first rod 35. The second spring 42 biases the second rod 36 downward. The first spring 41 has a spring constant which is lower than a spring constant of the second spring 42.

Figure 6:
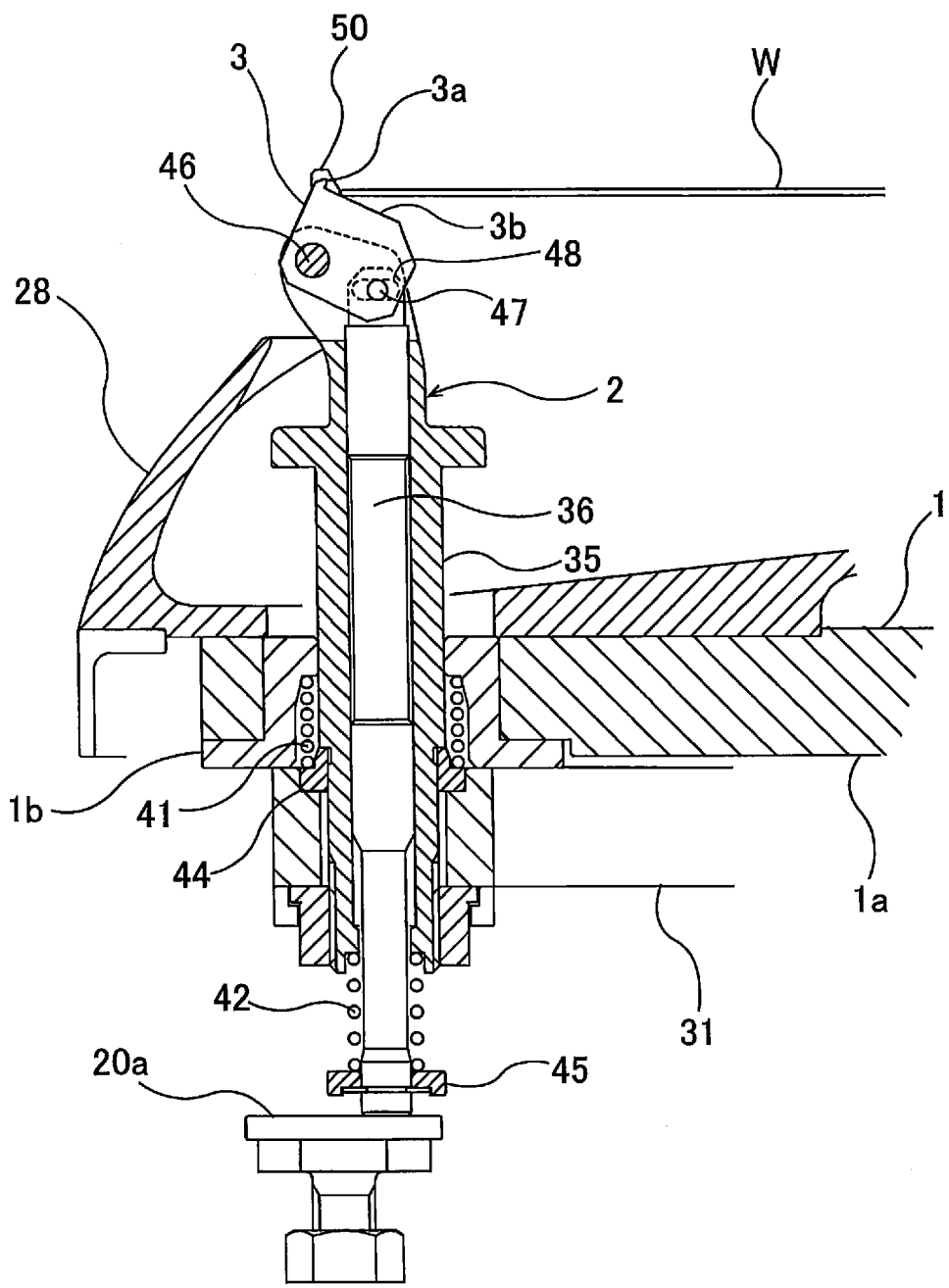
FIG. 6 is a diagram corresponding to FIG. 4, showing the substrate gripping apparatus when the support post is lifted by the lifting mechanism.

When the pusher 20a of the lifting mechanism 20 pushes up the second rod 36, an upward force is applied from the second spring 42 to the first rod 35, whereby the first rod 35 and the second rod 36 move upward together against a reaction force of the first spring 41. As shown in FIG. 6, the upward movement of the first rod 35 is stopped when the ring member 31 contacts the lower surface of the base 1, while the second rod 36 continues to move upward. The upward movement of the second rod 36 is stopped when the second rod 36 reaches a predetermined height. In this manner, the upward movement of the second rod 36 is stopped after the upward movement of the first rod 35 is stopped. Instead of the ring member 31, a stopper, which is brought into contact with the lower surface of the base 1, may be provided on each support post 2. Also in this case, the upward movement of the second rod 36 can be stopped after the upward movement of the first rod 35 is stopped.

The substrate holder 3 is rotatably supported by a support shaft 46 secured to the first rod 35. A pin 47 is secured to a lower portion of the substrate holder 3, and is inserted into an elongated hole 48 formed in the upper end of the second rod 36. Thus, the substrate holder 3 is coupled to the second rod 36 through engagement between the pin 47 and the elongated hole 48. The pin 47 and the elongated hole 48 constitute a coupling mechanism for coupling the substrate holder 3 to the second rod 36. As described above, the second rod 36 moves upward slightly relative to the first rod 35 after the upward movement of the first rod 35 is stopped. When the second rod 36 moves upward relative to the first rod 35, the second rod 36 pushes up the pin 47, which is secured to the substrate holder 3, to thereby rotate the substrate holder 3 slightly about the support shaft 46.

Figure 7A:
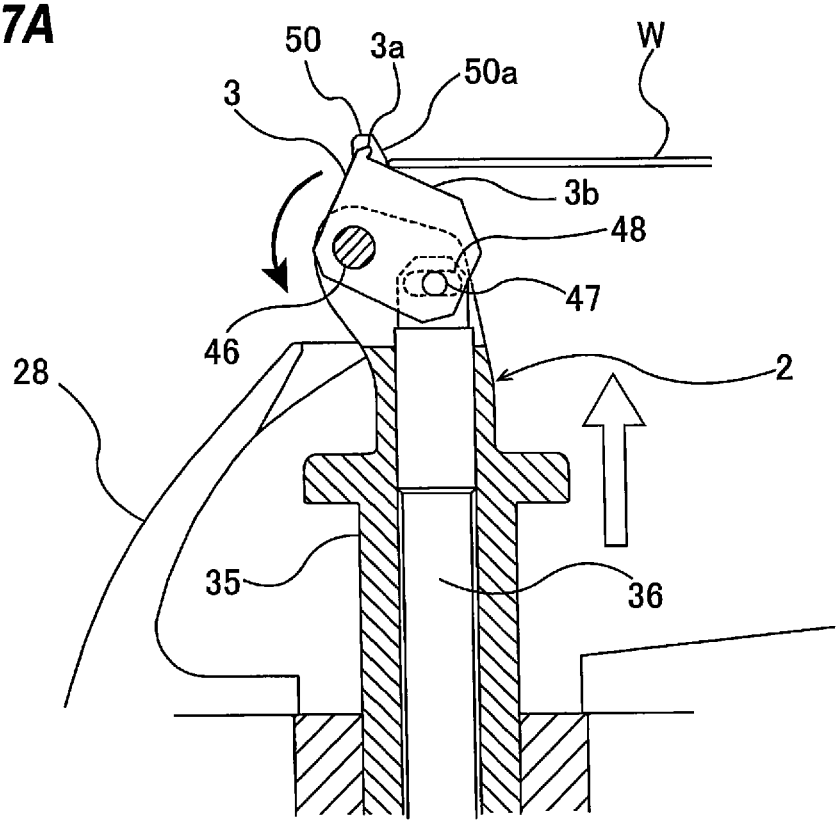
FIG. 7A is a diagram showing the substrate holder when the support post is in a raised position.
Figure 7B:
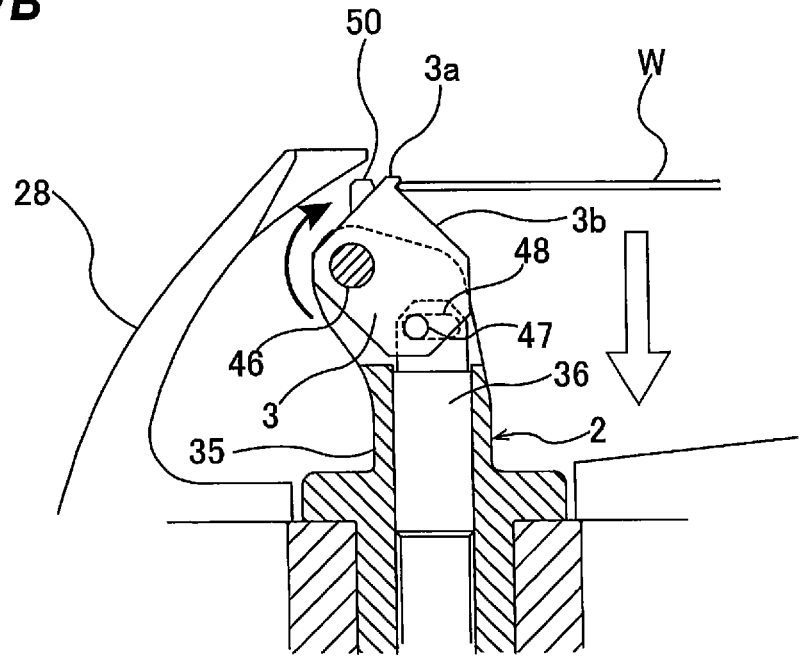
FIG. 7B is a diagram showing the substrate holder when the support post is in a lowered position.

FIG. 7A is a diagram showing the substrate holder 3 when the support post 2 is in a raised position, and FIG. 7B is a diagram showing the substrate holder 3 when the support post 2 is in a lowered position. As shown in FIG. 7A, when the substrate holder 3 is slightly rotated about the support shaft 46 with the upward movement of the support post 2, the chuck potion 3a is separated from the peripheral portion of the wafer W. Thus, the wafer W is released from the substrate holder 3. In this manner, by simply moving the support post 2 upward, the substrate holder 3 can be moved (or rotated) in a direction in which the chuck portion 3a moves away from the peripheral portion of the wafer W to thereby release the wafer W. The wafer W that has been released from the chuck portion 3a stays on the slope 3b of the substrate holder 3. In this state, the wafer W is carried out of the substrate holder 3 by a not-shown transporting mechanism. When another wafer is carried in, this wafer is placed on the slope 3b with the support post 2 in the raised position.

Operation of gripping the wafer W is performed as follows. When the pusher 20a is lowered with the wafer W placed on the slope 3b, the support post 2 and the substrate holder 3 are lowered by the reaction forces of the first spring 41 and the second spring 42. When the support post 2 is lowered, the second rod 36 is started to be lowered before the first rod 35 is started to be lowered. Therefore, as shown in FIG. 7B, the substrate holder 3, which is coupled to the second rod 36, is rotated about the support shaft 46 in a direction in which the chuck portion 3a moves closer to the peripheral portion of the wafer W until the chuck portion 3a comes into contact with the peripheral portion of the wafer W, so that the wafer W is gripped by the substrate holder 3.

The four substrate holders 3 operate simultaneously to grip the peripheral portion of the wafer W. When the chuck portions 3a of the four substrate holders 3 grip the peripheral portion of the wafer W, centering of the wafer W is completed at the same time. In this manner, by simply lowering the support posts 2, the substrate holders 3 is moved (or rotated) in the direction in which the chuck portions 3a move closer to the peripheral portion of the wafer W, thereby gripping the wafer W with the chuck portions 3a and simultaneously performing centering of the wafer W. The ring member 31 is provided mainly for the purpose of lowering the four support posts 2 in synchronization. For instance, even if some of the four support posts 4 cannot move vertically in a smooth manner for some reason, the four support posts 4 held by the ring member 31 can be lowered in synchronization.

As shown in FIG. 5B, a substrate guide member 50 for guiding the wafer W, which has been transported from a transport device, to the substrate holder 3 is fixed to the upper end of each second rod 36 by screws 51. The substrate guide member 50 is moved vertically together with the second rod 36. Therefore, the substrate guide member 50 is moved vertically relative to the first rod 35. More specifically, when the support post 2 is raised, the substrate holder 3 is rotated in the direction in which the chuck portion 3a moves away from the peripheral portion of the wafer W and, in synchronization with this movement, the substrate guide member 50 is moved upward relative to the substrate holder 3 until an upper end of the substrate guide member 50 projects upward from the substrate holder 3 as shown in FIG. 7A. The substrate guide member 50 has, at its upper end, a tapered surface 50a for guiding the peripheral portion of the wafer W to the slope (upper surface) 3b of the substrate holder 3. As the substrate guide member 50 is raised relative to the substrate holder 3, the tapered surface 50a is moved to a position above the slope 3b. Therefore, the peripheral portion of the wafer W is guided by the tapered surface 50a to the slope 3b of the substrate holder 3.

When the support post 2 is lowered, the second rod 36 is started to move downward before the first rod 35 is started to move downward. Therefore, the pin 47 in engagement with the elongated hole 48 is lowered together with the second rod 36. As a result, the substrate holder 3 is rotated about the support shaft 46 in the direction in which the chuck portion 3a moves closer to the peripheral portion of the wafer W. In synchronization with the rotation of the substrate holder 3, the substrate guide member 50 is lowered relative to the substrate holder 3 until the upper end of the substrate guide member 50 lies lower than the substrate holder 3 as shown in FIG. 7B. In this manner, when the wafer W is held by the substrate holders 3, the substrate guide members 50 are lower than the substrate holders 3. This arrangement enables a liquid, which has been supplied to the upper surface of the rotating wafer W, to be discharged from the peripheral portion of the wafer W by the centrifugal force without being disturbed by the substrate guide members 50. For example, in a case where the substrate gripping apparatus of this embodiment is applied to a wafer (substrate) cleaning apparatus, a cleaning liquid is supplied onto the upper surface of the wafer W that is being rotated by the motor 15. This cleaning liquid is forced out of the peripheral portion of the wafer W by the centrifugal force. If the substrate guide members 50 project upward from the substrate holders 3, the cleaning liquid can bounce off the substrate guide members 50 back onto the upper surface of the wafer W. The substrate gripping apparatus of this embodiment can avoid such bouncing of liquid.

Figure 8A:
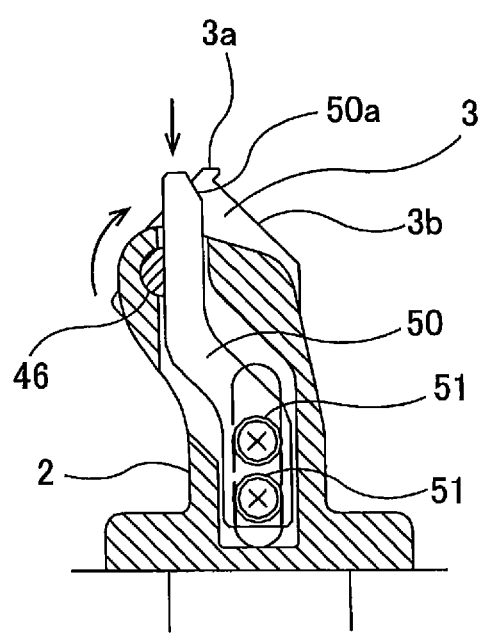
FIG. 8A is a diagram showing the substrate holder and a substrate guide member when the support post is in the lowered position.
Figure 8B:
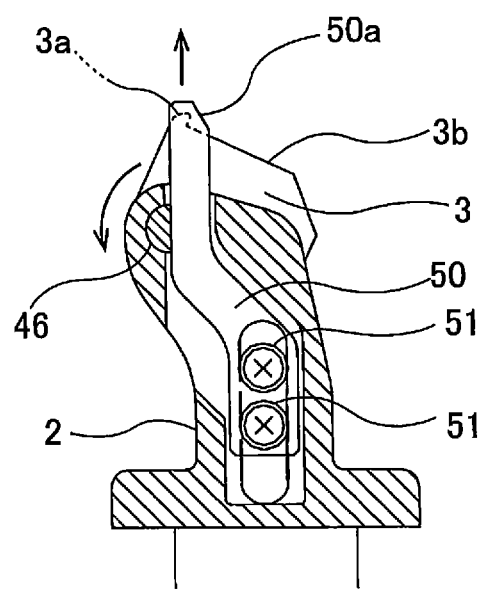
FIG. 8B is a diagram showing the substrate holder and the substrate guide member when the support post is in the raised position.

FIG. 8A is a diagram showing the substrate holder 3 and the substrate guide member 50 when the support post 2 is in the lowered position, and FIG. 8B is a diagram showing the substrate holder 3 and the substrate guide member 50 when the support post 2 is in the raised position. As shown in FIG. 8A, when the support post 2 is in the lowered position, the tapered surface 50a of the substrate guide member 50 lies outwardly of the slope 3b of the substrate holder 3. As shown in FIG. 8B, when the support post 2 is in the raised position, the tapered surface 50a of the substrate guide member 50 lies just above the slope 3b of the substrate holder 3. Accordingly, the wafer W from a transport device is once received on the tapered surface 50a of the substrate guide member 50, guided downward along the tapered surface 50a, and then placed on the slope 3b of the substrate holder 3. The substrate holders 3 can thus securely grip the wafer W.

Figure 9:
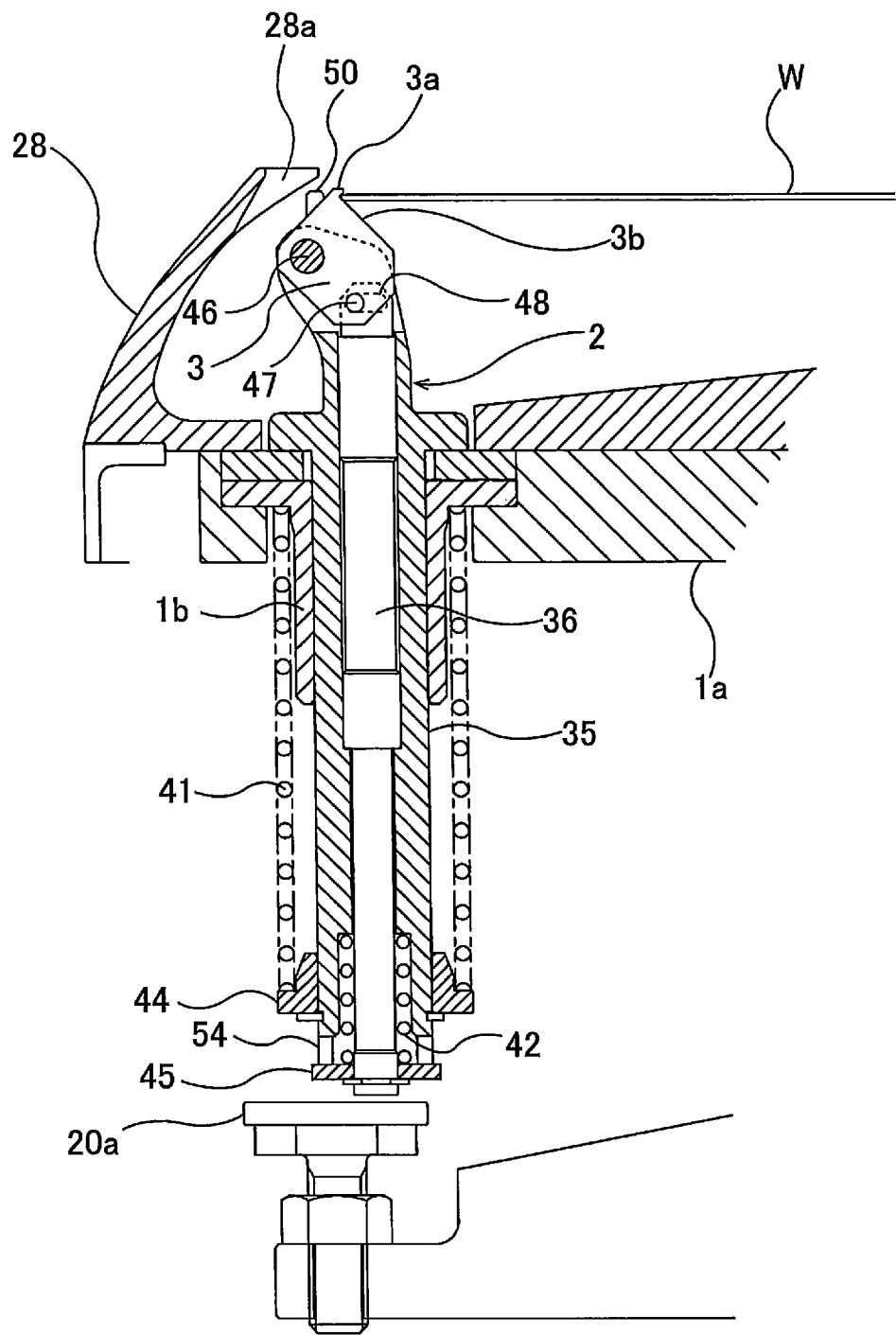
FIG. 9 is a diagram showing a substrate gripping apparatus according to a second embodiment.

FIG. 9 is a diagram showing the substrate gripping apparatus according to a second embodiment. With reference to the construction and the operation of this embodiment which are the same as those of the above-described first embodiment, a duplicate description thereof will be omitted. In this embodiment, the first spring 41 has a spring constant which is higher than a spring constant of the second spring 42. Therefore, when the pusher 20a of the lifting mechanism 20 lifts the support post 2, the second rod 36 is firstly started to be raised, and subsequently the first rod 35 is started to be raised.

Figure 10:
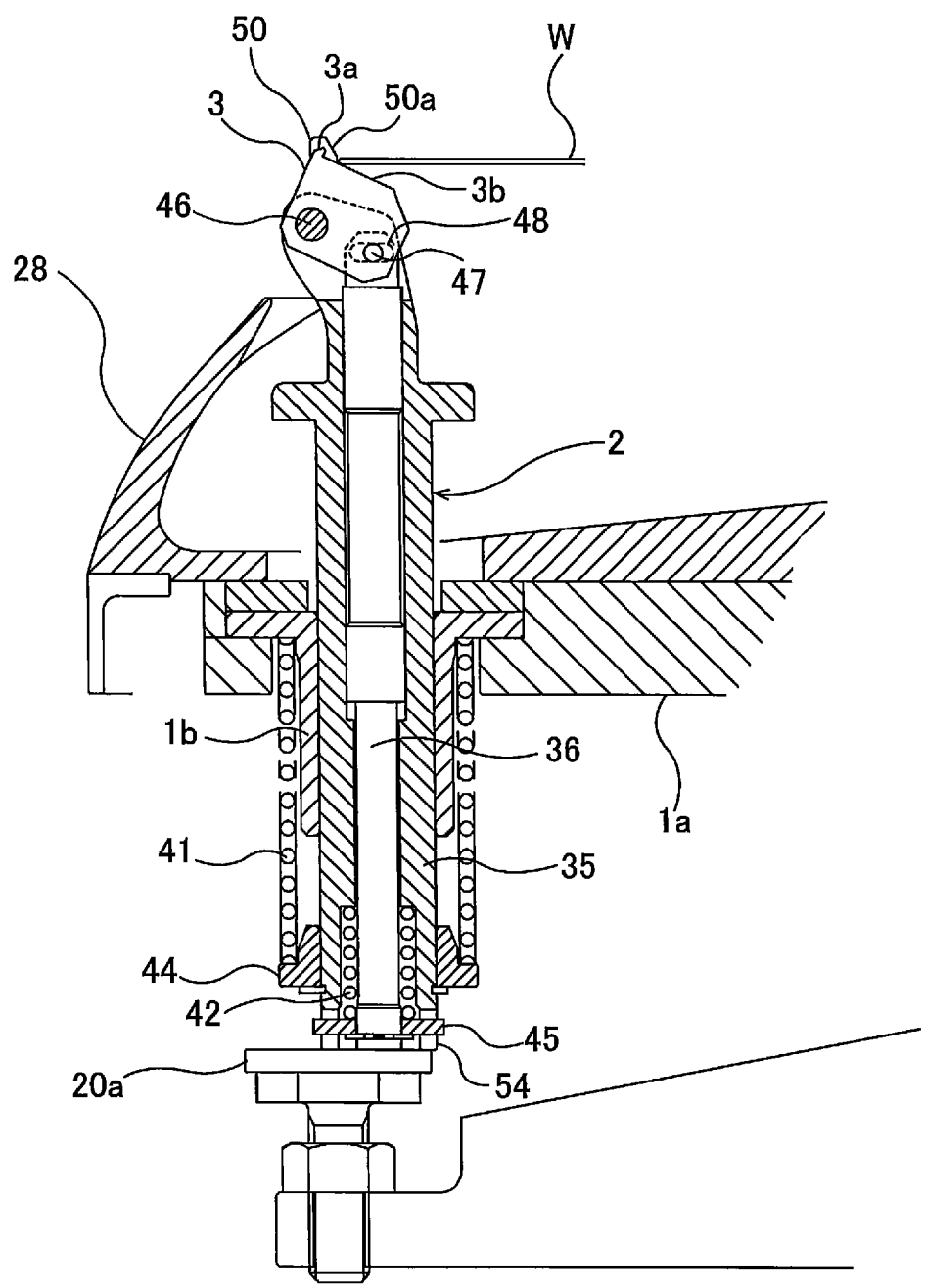
FIG. 10 is a diagram showing the substrate gripping apparatus of FIG. 9 when the support post is lifted by the lifting mechanism.

FIG. 10 is a diagram showing the substrate gripping apparatus when the support post 2 is raised by the lifting mechanism 20. A load transmission member 54, which contacts the pusher 20a, is secured to the lower end of the first rod 35. This load transmission member 54 extends downward through the stopper 45 of the second rod 36. When the second spring 42 is compressed, the pusher 20a comes into contact with the load transmission member 54 and raises the first rod 35 together with the second rod 36. It is noted that the present invention is not limited to the illustrated embodiment. For example, the substrate gripping apparatus may be configured such that a part of the spring stopper 45 comes into contact with the lower end of the first rod 35. The ring member 31 is not provided in this embodiment.

In the above-described first embodiment, immediately before the support posts 2 stop their upward movement, the substrate holders 3 are rotated (or moved) in such a direction as to release the peripheral portion of the wafer W, while in the second embodiment the substrate holders 3 are rotated (or moved) in such a direction as to release the peripheral portion of the wafer W when the upward movement of the support posts 2 is started. Therefore, in the second embodiment, the wafer W moves upward together with the support posts 2 with the chuck portions 3a of the substrate holders 3 separated from the peripheral portion of the wafer W. The substrate guide members 50 operate in the same manner as in the first embodiment. Thus, each substrate guide member 50 moves vertically relative to the substrate holder 3 in synchronization with the movement (rotation) of the substrate holder 3.

While the present invention has been described with reference to the embodiments, it is understood that the present invention is not limited to the embodiments described above, but is capable of various changes and modifications within the scope of the inventive concept as expressed herein.

What is claimed is:

1. A substrate gripping apparatus, comprising:
   a base;
   a plurality of support posts which are supported by the base and are vertically movable relative to the base;
   a lifting mechanism configured to lift the support posts; and
   a substrate holder and a substrate guide member mounted to each of the support posts,
   each of the support posts including a relative movement mechanism configured to move the substrate holder and the substrate guide member relative to each other,
   the relative movement mechanism being configured
      to move the substrate holder in such a direction that the substrate holder releases a peripheral portion of a substrate, while raising the substrate guide member relative to the substrate holder, when the support post moves upward, and
      to move the substrate holder in such a direction that the substrate holder grips the peripheral portion of the substrate, while lowering the substrate guide member relative to the substrate holder, when the support post moves downward.

2. The substrate gripping apparatus according to claim 1, wherein the relative movement mechanism includes:
   a first rod;
   a second rod configured to be vertically movable relative to the first rod and to be lifted by the lifting mechanism;
   a first spring arranged between the base and the first rod and configured to bias the first rod downward;
   a second spring arranged between the first rod and the second rod and configured to bias the second rod downward;
   a support shaft secured to the first rod and configured to rotatably support the substrate holder; and
   a coupling mechanism configured to couple the second rod to the substrate holder.

3. The substrate gripping apparatus according to claim 2, wherein the first spring has a spring constant which is lower than a spring constant of the second spring.

4. The substrate gripping apparatus according to claim 2, wherein the first spring has a spring constant which is higher than a spring constant of the second spring.

5. The substrate gripping apparatus according to claim 2, wherein the substrate guide member is secured to the second rod.

6. The substrate gripping apparatus according to claim 1, wherein the relative movement mechanism is configured to raise the substrate guide member to a position higher than the substrate holder and lower the substrate guide member to a position lower than the substrate holder.

7. The substrate gripping apparatus according to claim 1, wherein the substrate holders are arranged at equal intervals around a central axis of the base and are configured to perform centering of the substrate by gripping the peripheral portion of the substrate.

8. The substrate gripping apparatus according to claim 1, wherein:
   the substrate holder has a chuck portion configured to grip the peripheral portion of the substrate and a slope on which the peripheral portion of the substrate is to be placed; and
   the chuck portion is formed integrally on the slope.

9. A substrate gripping apparatus, comprising:
   a base;
   a plurality of support posts which are supported by the base and are vertically movable between a raised position and a lowered position relative to the base;
   a substrate holder mounted to each of the support posts and to move according to a vertical motion of the support posts to grip a peripheral portion of the substrate when the support posts are in the lowered position and to release the peripheral portion of the substrate when the support posts are in the raised position; and
   a substrate guide member mounted to each of the support posts and to move according to the vertical motion of the support posts to guide the peripheral portion of the substrate when the support posts are in the raised position, the substrate guide member being lower than the substrate holder when the support posts are in the lowered position.

10. A substrate gripping apparatus, comprising:
    a base;
    a plurality of support posts which are supported by the base and are vertically movable relative to the base;
    a lifting mechanism configured to lift the support posts; and
    a substrate holder and a substrate guide member mounted to each of the support posts,
    each of the support posts including a relative movement mechanism configured to move the substrate holder and the substrate guide member relative to each other,
    the relative movement mechanism being configured
       to move the substrate holder in such a direction that the substrate holder releases a peripheral portion of a substrate when the support post moves upward, thereby positioning the substrate guide member at a location higher than an upper end of the substrate holder, and
       to move the substrate holder in such a direction that the substrate holder grips the peripheral portion of the substrate when the support post moves downward, thereby positioning the substrate guide member at a location lower than the upper end of the substrate holder.

11. The substrate gripping apparatus according to claim 10, wherein:
the substrate holder has a chuck portion configured to grip the peripheral portion of the substrate and a slope on which the peripheral portion of the substrate is to be placed; and
the chuck portion is formed integrally on the slope.

12. The substrate gripping apparatus according to claim 11, wherein:
the substrate guide member has a tapered surface for guiding the peripheral portion of the substrate; and
the tapered surface lies outwardly of the slope of the substrate holder when the support post is in a lowered position, and the tapered surface lies just above the slope of the substrate holder when the support post is in a raised position.

13. The substrate gripping apparatus according to claim 10, wherein the relative movement mechanism includes:
a first rod;
a second rod configured to be vertically movable relative to the first rod and to be lifted by the lifting mechanism;
a first spring arranged between the base and the first rod and configured to bias the first rod downward;
a second spring arranged between the first rod and the second rod and configured to bias the second rod downward;
a support shaft secured to the first rod and configured to rotatably support the substrate holder; and
a coupling mechanism configured to couple the second rod to the substrate holder.

14. The substrate gripping apparatus according to claim 1, wherein the substrate guide member is fixed to a member of the support post such that the substrate guide member moves with the member of the support post.

\* \* \* \* \*